United States Patent [19]
Sparks et al.

[11] Patent Number: 5,737,566
[45] Date of Patent: Apr. 7, 1998

[54] DATA PROCESSING SYSTEM HAVING A MEMORY WITH BOTH A HIGH SPEED OPERATING MODE AND A LOW POWER OPERATING MODE AND METHOD THEREFOR

[75] Inventors: Robert Wayne Sparks, Kyle; Wallace Baker Harwood, III, Austin; Thomas Jew, Austin; James Bradley Eifert, Austin, all of Tex.

[73] Assignee: Motorola, Inc., Schaumburg, Ill.

[21] Appl. No.: 169,103

[22] Filed: Dec. 20, 1993

[51] Int. Cl.⁶ .......................... G06F 12/00; G06F 13/00
[52] U.S. Cl. ........................ 395/427; 364/DIG. 1; 364/707; 365/189.07; 365/227; 395/479; 395/490; 395/494
[58] Field of Search ........................... 364/200, 707; 365/189.08, 189.11, 203, 230, 227, 189.07; 395/400, 425, 427, 479, 490, 494, 750, 481

[56] References Cited

U.S. PATENT DOCUMENTS

| | | | |
|---|---|---|---|
| 4,563,598 | 1/1986 | Oritani | 307/449 |
| 4,575,821 | 3/1986 | Eden et al. | 365/154 |
| 4,578,778 | 3/1986 | Aoyama | 395/190 |
| 4,653,025 | 3/1987 | Minato et al. | 395/154 |
| 4,744,063 | 5/1988 | Ohtani et al. | 365/233 |
| 4,800,529 | 1/1989 | Ueno | 365/189 |
| 4,814,982 | 3/1989 | Weir | 395/425 |
| 4,899,315 | 2/1990 | Houston | 365/230.06 |
| 5,121,492 | 6/1992 | Saville, III et al. | 395/500 |
| 5,155,840 | 10/1992 | Niijima | 395/550 |
| 5,208,774 | 5/1993 | Shibue | 365/189.08 |
| 5,208,783 | 5/1993 | Ninomiya et al. | 365/233 |
| 5,237,699 | 8/1993 | Little et al. | 395/750 |
| 5,239,639 | 8/1993 | Fischer et al. | 395/494 |
| 5,251,178 | 10/1993 | Childers | 365/277 |
| 5,276,858 | 1/1994 | Oak et al. | 395/550 |
| 5,301,278 | 4/1994 | Bowater et al. | 395/275 |
| 5,305,460 | 4/1994 | Kaneko et al. | 395/775 |
| 5,325,499 | 6/1994 | Kummer et al. | 395/494 |
| 5,359,533 | 10/1994 | Shiomi | 365/189.11 |
| 5,384,747 | 1/1995 | Clohset | 365/226 |
| 5,414,670 | 5/1995 | Schaefer | 365/230.03 |
| 5,418,924 | 5/1995 | Dresser | 391/425 |
| 5,432,747 | 7/1995 | Fuller et al. | 365/203 |
| 5,463,756 | 10/1995 | Saito et al. | 395/494 |

*Primary Examiner*—Tod R. Swann
*Assistant Examiner*—Tuan V. Thai
*Attorney, Agent, or Firm*—Daniel D. Hill

[57] ABSTRACT

A data processing system having a memory with a low power operating mode and a method of operation is described. An static random access memory (SRAM) (18) having a low power operating mode is provided for a data processing system (10). A programmable control bit is used for switching the SRAM (18) from a one clock cycle operating mode to a two clock cycle, or low power, operating mode. Initially, during the two cycle operating mode, only a bus interface unit (41) is active. During the first cycle, an address is compared to determine if the address is a valid address. If the address is valid, address decoders (42) are enabled, and a data transfer is completed on the second clock cycle. If the address is not valid, the address decoders (42) remain disabled and memory array (43) remains in a quiescent state consuming minimum power. During one cycle mode, the SRAM (18) decodes every address in order to respond in one clock cycle to a valid address.

16 Claims, 3 Drawing Sheets

DATA PROCESSING SYSTEM HAVING A MEMORY WITH BOTH A HIGH SPEED OPERATING MODE AND A LOW POWER OPERATING MODE AND METHOD THEREFOR

FIELD OF THE INVENTION

This invention relates generally to data processing systems, and more particularly, to a data processing system having a memory with a low power operating mode.

BACKGROUND OF THE INVENTION

Data processing systems, such as microcontrollers, commonly use on-board memory. There are various types of memory used on-board a microcontroller, including both volatile and nonvolatile memory. One type of volatile memory that is used in high speed applications, such as when the microcontroller is used in a workstation, is static random access memory (SRAM). Compared to other types of on-board memory, a SRAM can operate at relatively high access speeds. However, high speed operation generally requires high power consumption, which is undesirable for applications such as battery powered computers, where low power consumption may be more important than high speed operation.

To reduce power consumption in prior art data processing systems having an on-board SRAM, the on-board SRAM may be disabled when it is not being used. However, an access to the SRAM requires that it be re-enabled before the access can occur, which requires the data processing system to wait until the SRAM is re-enabled. Also, lower power consumption has been achieved in a SRAM by operating the SRAM at a lower clock frequency. However, lowering the clock frequency at which the SRAM operates also affects the operation of the entire data processing system.

SUMMARY OF THE INVENTION

Accordingly, there is provided, in one form, a semiconductor memory having a memory array, an address decoder, and control circuitry. The memory array has a plurality of memory cells arranged in rows and columns, each memory cell coupled to a word line and to a bit line. The address decoder is coupled to the memory array and accesses a memory cell of the memory array in response to an address signal. The control circuitry is coupled to the address decoder and causes the memory cell to be accessed within a first predetermined time in response to a control signal being in a first predetermined logic state. The control circuitry causes the memory cell to be accessed within a second predetermined time in response to the control signal being in a second predetermined logic state.

Also, there is provided, in another form, a method for accessing the memory array. These and other features and advantages will be more clearly understood from the following detailed description taken in conjunction with the accompanying drawings.

DESCRIPTION OF A PREFERRED EMBODIMENT

Generally, the present invention provides a low power operating mode for an on-board memory in a data processing system. This is accomplished by providing a programmable control bit for switching from a one clock cycle access mode to a two clock cycle access mode. During two cycle mode, only the bus interface unit (BIU) for the memory is active during each bus transation. During the first cycle of the two cycle access, the address is compared to determine if the address is a valid SRAM address. If the address is valid, the address decoders are enabled, or activated, and a data transfer is completed on the next cycle. If the address is not valid, the address decoders are not enabled and the memory array remains in a quiescent state consuming minimum power. During one cycle mode, the SRAM decodes every address so that it can respond in one cycle to a valid address.

The present invention can be more fully described with reference to FIG. 1–6. The terms "assert" and "negate" will be used when referring to the rendering of a signal, status bit, or similar apparatus into its logically true or logically false state, respectively. If the logically true state is a digital logic level one, the logically false state will be a digital logic level zero. And if the logically true state is a digital logic level zero, the logically false state will be a digital logic level one. The term "bus" will be used to refer to a plurality of signals which may be used to transfer one or more various types of information, such as data, addresses, control, or status.

Figure 1:
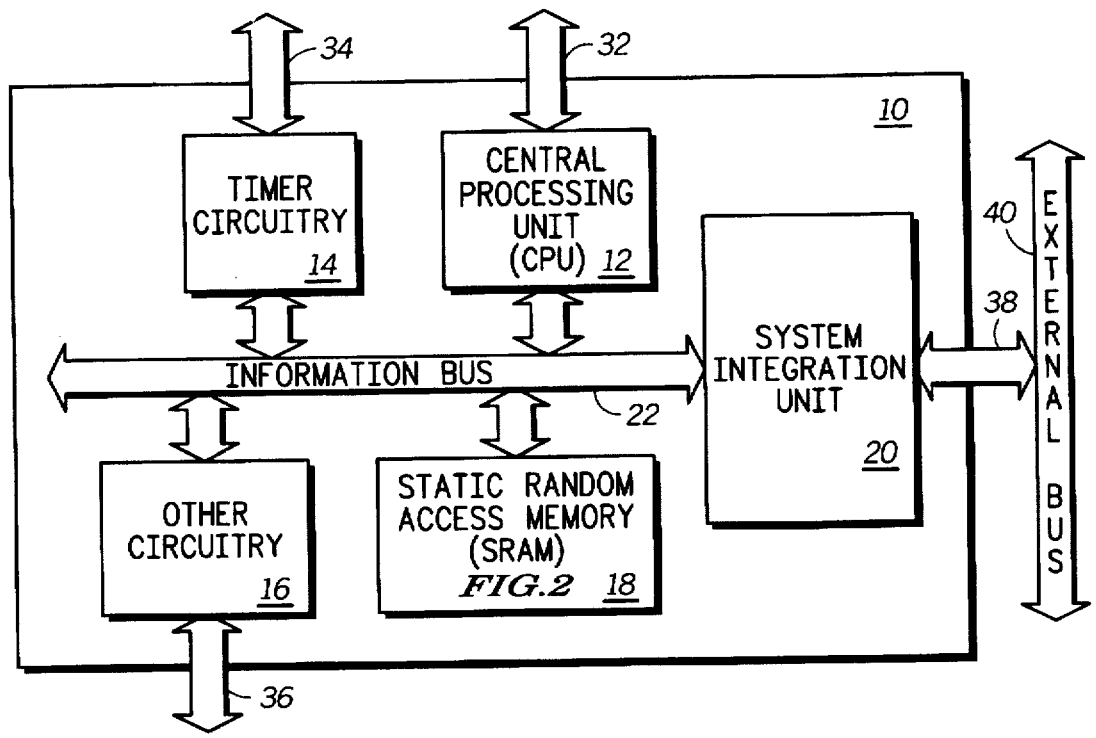
FIG. 1 illustrates in block diagram form, a data processing system in accordance with one embodiment of the present invention.

FIG. 1 illustrates in block diagram form, a data processing system 10 in accordance with one embodiment of the present invention. Data processing system 10 can be implemented as a single integrated circuit called a microcontroller. Data processing system 10 has various on-board peripherals which are bi-directionally coupled by way of an information bus 22. The particular embodiment of data processing system 10 illustrated in FIG. 1 has a central processing unit (CPU) 12, timer circuitry 14, static random access memory (SRAM) 18, other circuitry 16, and system integration unit 20, which are all bi-directionally coupled to information bus 22. Other circuitry 16 may include, for example, a read only memory (ROM), an analog-to-digital converter, serial circuitry, or an electrically erasable programmable read only memory (EEPROM).

System integration unit 20 can receive and transmit signals external to data processing system 10 by way of integrated circuit pins 38. Integrated circuit pins 38 may optionally be coupled to an external bus 40. CPU 12 may optionally receive and transmit signals external to data processing system 10 by way of integrated circuit pins 32. Timer circuitry 14 can receive and transmit signals external to data processing system 10 by way of integrated circuit pins 34.

The embodiment of data processing system 10 which is shown in FIG. 1 illustrates one particular microcontroller within a family of microcontrollers. Because microcontrollers in the same family generally have a plurality of differing on-board peripherals. FIG. 1 provides only one embodiment of data processing system 10. Alternate embodiments of data processing system 10 may have fewer, more, or different on-board peripherals than those illustrated in FIG. 1.

Figure 2:
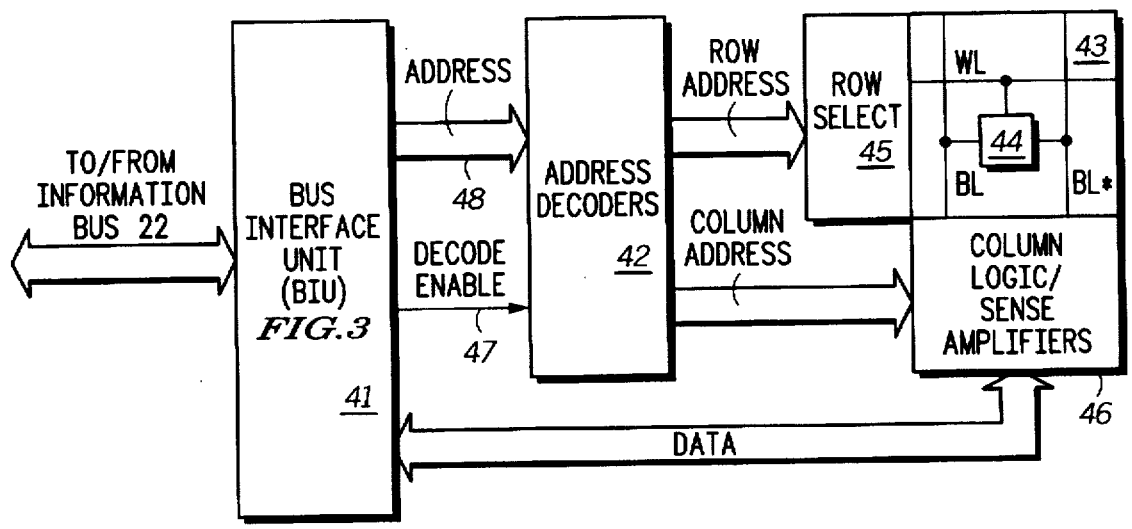
FIG. 2 illustrates in block diagram form, the static random access memory of FIG. 1 in accordance with one embodiment of the present invention.

FIG. 2 illustrates in block diagram form, static random access memory 18 of FIG. 1 in accordance with one embodiment of the present invention. SRAM 18 includes bus interface unit (BIU) 41, address decoders 42, row select circuits 45, column logic/sense amplifiers 46, and memory array 43.

BIU 41 is coupled to information bus 22 in order to allow SRAM 18 to communicate with other portions of circuitry in data processing system 10. For example, BIU 41 may receive address and data signals from CPU 12 across information bus 22, and BIU 41 may transfer data signals back to CPU 12 across information bus 22. BIU 41 transfers address signals to address decoders 42. BIU 41 is also bi-directionally coupled to column logic/sense amplifiers 46 for transferring data signals to and from column logic/sense amplifiers 46. BIU 41 also provides an address decode enable signal 47 for enabling or disabling address decoders 42. Address decode enable signal 47 will be discussed later in more detail in the discussion of FIG. 3.

Memory array 43 is a conventional SRAM array and includes an array of SRAM cells arranged in rows and columns. Each SRAM cell is coupled to a word line and to a bit line pair. The word lines are connected to row select circuits 45, and the bit line pairs are connected to column logic/sense amplifiers 46. When accessing memory array 43, a predetermined number of address signals are provided to address decoders 42. The predetermined number of address signals includes a row address portion and a column address portion. The row address portion is provided to the row select circuit 45 and the column address portion is provided to column logic/sense amplifiers 46. The row address is used to select a particular word line and the column address is used to select a particular bit line pair. The particular number of address signals or amount of decoding is not important for purposes of describing the invention, and may be different in other embodiments. Also, in other embodiments, memory array 43 may be subdivided into sections or blocks. Included in SRAM 18, but not shown, are bit line loads, write drivers, bit line precharge and equalization circuitry. A memory cell located at the intersection of a selected word line and bit line pair may be accessed for either a read cycle or a write cycle. A representative memory cell 44 is shown connected to a word line labeled "WL", and to a bit line pair labeled "BL" and "BL*". Note that an asterisk (*) after a signal or line name indicates that the signal or line is a logical complement of a signal or line having the same name but lacking the asterisk (*).

During a read cycle of SRAM 18, a valid address selects a memory cell to be accessed, for example memory cell 44. Information is provided by memory cell 44 to bit line pair BL/BL*, in the form of a differential voltage across the bit line pair. Sense amplifiers in column logic/sense amplifiers 46 senses and amplifiers the differential voltage and provides the differential voltage to BIU 41.

During a write cycle of SRAM 18, the operation is essentially reversed. Data is provided to column logic/sense amplifiers 46 by BIU 41. A selected bit line pair, for example bit line pair BL/BL*, receives the data in the form of a differential voltage, and provides the differential voltage to a memory cell that is coupled to the selected word line and bit line pair.

SRAM 18 has two modes of operation which are programmable by a user, a normal, or one cycle mode, and a low power, or two cycle mode. During the one cycle mode, address decode enable signal 47 is asserted to enable the address decoders on each transaction from information bus 22, so that an access of memory array 43 occurs in one clock cycle to allow high speed operation.

During the two cycle mode, an access of SRAM 18 requires two clock cycles. Address decode enable signal 47 is asserted in the next clock cycle after a valid address is received from information bus 22. In two cycle mode, since the address decoders are only enabled when a valid address is received, power consumption is reduced as compared to the one cycle mode of operation. Note that in the illustrated embodiment, during low power mode, an access to memory array 43 occurs in two clock cycles. In other embodiments, an access to memory array 43 may occur in a predetermined time that is different than two clock cycles. Also, in the illustrated embodiment, memory array 43 is an SRAM array. In other embodiments, memory array 43 may be any other type of volatile or nonvolatile memory array, including but not limited to, dynamic random access memory (DRAM), read only memory (ROM), programmable read only memory (PROM), and electrically erasable programmable read only memory (EEPROM)

Figure 3:
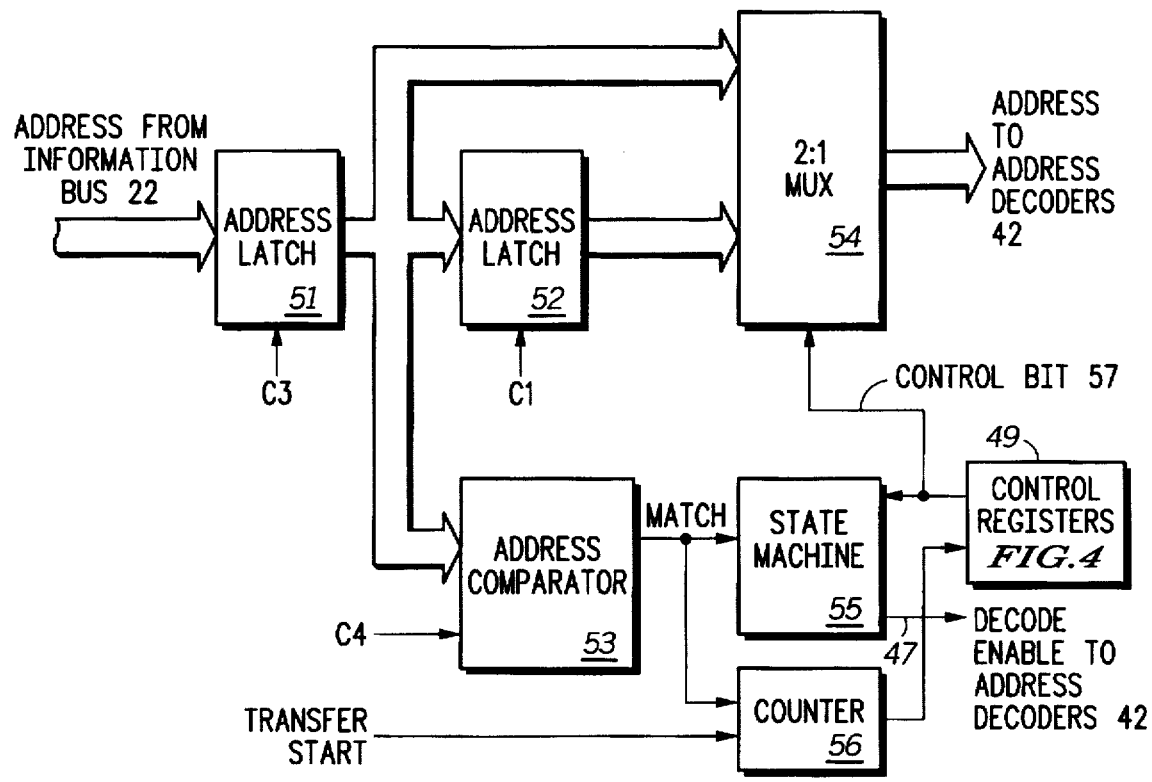
FIG. 3 illustrates in block diagram form, the bus interface unit of FIG. 2 in accordance with one embodiment the present invention.
Figure 5:
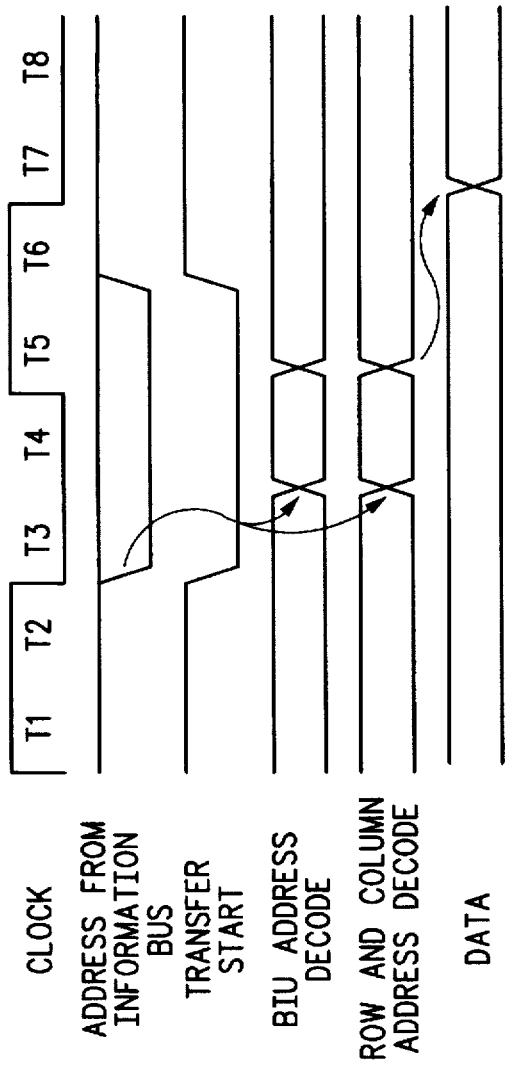
FIG. 5 illustrates a timing diagram of various signals of the static random access memory of FIG. 2 during a one cycle access mode.
Figure 6:
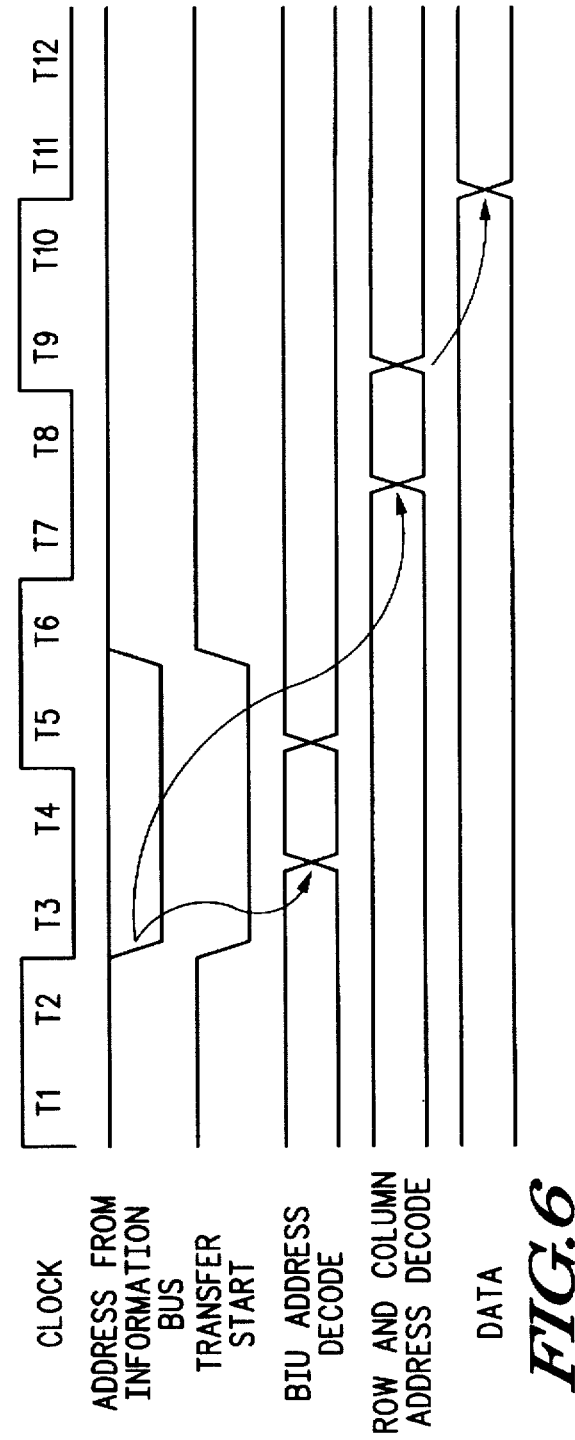
FIG. 6 illustrates a timing diagram of various signals of the static random access memory of FIG. 2 during a two cycle access mode.

FIG. 3 illustrates in block diagram form, BIU 41 of FIG. 2 in accordance with one embodiment of the present invention. BIU 41 includes address latches 51 and 52, multiplexer 54, address comparator 53, state machine 55, control registers 49, and counter 56. Address latch 51 has input terminals coupled to information bus 22, an input terminal for receiving control signal C3, and output terminals coupled to address latch 52, multiplexer 54, and address comparator 53. Also, address latch 52 has an input terminal for receiving control signal C1, and output terminals connected to multiplexer 54. Address comparator 53 has input terminals for receiving an address from address latch 51, an input terminal for receiving control signal C4, and an output terminal for providing an address match signal labeled "MATCH". State machine 55 has an input terminal connected to address comparator 53 for receiving match signal MATCH, an input terminal connected to control registers 49, and an output terminal connected to address decoders 42 for providing decode enable signal 47. Control registers 49 has an input terminal connected to counter 56, and an output terminal for providing control bit 57 of control registers 49 to state machine 55 and to multiplexer 54. Counter 56 has an input terminal for receiving match signal MATCH from address comparator 53, an input terminal for receiving a transfer start signal labeled "TRANSFER START", and an output terminal connected to control registers 49. Control signals C1, C3, and C4 are numbered to correspond to the phase of the clock signal shown in the timing diagrams of FIG. 5 and FIG. 6. FIG. 5 and 6 will be discussed later.

BIU 41 functions to interface memory array 43 to information bus 22. Address latch 51 receives an address from information bus 22 on each clock cycle and provides the address to address latch 52. The address is also provided to address comparator 53 and to multiplexer 54 based on timing information provided by control signals C1, C3, and C4 respectively. Address comparator 53 provides a match signal to state machine 55. Control information is also provided to state machine 55 by control bit 57. Another input to multiplexer 54 is provided by address latch 52.

In one cycle mode, control bit 57 is programmed by the user to provide a logic zero to state machine 55 and to multiplexer 54. The output of address latch 51 is provided to address decoders 42 on every clock cycle via multiplexer 54. Also, address decoder 42 (FIG. 2) is enabled during each clock cycle by decode enable signal 47 from state machine 55. This allows memory array 43 to transfer data to or from BIU 41 in the same cycle that a valid address is received.

In two cycle mode, control bit 57 is programmed by the user to provide a logic one to state machine 55 and to multiplexer 54. The output of second address latch 52 is provided to address decoders 42 on every clock cycle via multiplexer 54. Address decoders 42 are disabled by decode enable signal 47 from state machine 55. On each clock cycle, address comparator 53 determines if the address it receives is a valid address for accessing memory array 43 for a read or a write operation. When a valid address is received, match signal MATCH is asserted by address comparator 53 and provided to state machine 55. During a subsequent cycle, state machine 55 asserts decode enable signal 47. Decode enable signal 47 causes address decoders 42 to be enabled, thus accessing the memory array for a read or a write operation. Data is then transferred between BIU 41 and memory array 43. If a valid address is not received, decode enable signal 47 is negated. The address decoders then remain disabled, or inactive, to reduce the power consumption of data processing system 10.

Counter 56 monitors transfer start signal TRANSFER START from information bus 22 as well as match signal MATCH from address comparator 53. Based on this information, the counter can automatically assert or negate the control bit 57 to automatically change from two cycle mode to one cycle mode or back.

Counter 56, as shown in FIG. 3, provides an automatic, self-monitoring mechanism to switch SRAM 18 from one cycle mode to two cycle mode and back to one cycle mode. Counter 56 monitors transfer start signal TRANSFER START from information bus 22 and match signal MATCH from address comparator 53 to determine the number of information bus 22 transactions which target SRAM 18. If counter 56 determines that the number of consecutive SRAM 18 accesses falls below a predetermined value, SRAM 18 automatically switches to two cycle mode for reduced power consumption. While in two cycle mode, SRAM 18 may automatically switch to single cycle mode if counter 56 determines that the number of consecutive SRAM 18 accesses rises above the predetermined value. The predetermined value may be defined as either a fixed number of consecutive SRAM 18 accesses or as a ratio of SRAM 18 accesses compared with a fixed number of past information bus 22 transactions.

In an alternative implementation, match signal MATCH from address comparator 53 could simply cause counter 56 to put SRAM 18 into one cycle mode for a predetermined number of assertions of transfer start signal TRANSFER START from information bus 22. The predetermined number of cycles could be programmed via a data transfer on information bus 22. Also, in other embodiments, state machine 55 may be another type of control logic such as a programmable logic array.

Figure 4:
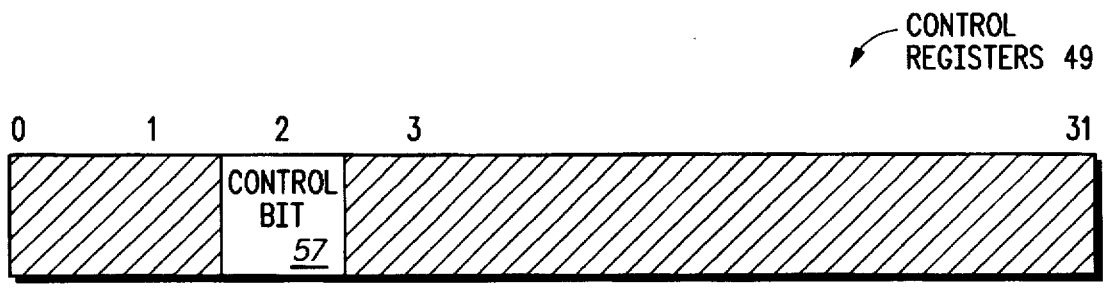
FIG. 4 illustrates in block diagram form, the control register of FIG. 3 in accordance with one embodiment of the present invention.

FIG. 4 illustrates in block diagram form, control registers 49 of FIG. 3 in accordance with one embodiment of the present invention. Control registers 49 includes 32 control bits. In other embodiments, control registers 49 may include more or fewer control bits. Control bit 57 is programmable by the user to provide a predetermined control value, and controls whether memory array 43 is accessed in one clock cycle or two clock cycles. When control bit 57 is asserted, SRAM 18 operates in two cycle mode. When control bit 57 is negated, SRAM 18 operates in one cycle mode. In other embodiments, control bit 57 may include more that one control bit.

FIG. 5 illustrates a timing diagram of various signals of SRAM 18 of FIG. 2 during one cycle, or normal access mode. Note that the clock signal is divided into four phases per cycle for reference, and each phase is labeled uniquely by "T" followed by a number. Note also that the various signals of FIG. 5 are not drawn to scale.

A transaction on information bus 22, that is directed to SRAM 18, begins at time T3. Address information and transfer start signal TRANSFER START are supplied at time T3. Address latch 51 captures addresses from information bus 22 during time T3 in response to control signal C3. During time T4, in response to receiving control signal C4, address comparator 53 begins decoding the address held in address latch 51 to determine if the address is valid for accessing SRAM 18. The address information held in address latch 51 is also passed through multiplexer 54 to address decoder 42. Address decoder 42 decodes rows and columns in memory array 43 during time T4. If the address is valid, and a read operation is required, the sense amplifiers in column logic/sense amplifiers 46 transfer data from memory array 43 to BIU 41 during times T5 and T6. BIU 41 relays data onto information bus 22 during time T7 if address comparator 53 determines that the information bus 22 transaction targets SRAM 18.

If address comparator 53 determines that the information bus 22 transaction does not target SRAM 18, BIU 41 does not transfer data onto information bus 22. Note that the address held in address latch 51 is decoded by address decoder 42 during time T4, even though the transaction may not have been targeting SRAM 18. This is because address comparator 53 does not have time to determine ownership of the information bus 22 transaction, and still be able to allow an access of SRAM 18 in one clock cycle. Therefore, the rows and columns of memory array 43 are decoded on every active bus cycle so that SRAM 18 is able to respond by the end of the cycle. Decoding each address allows high speed operation of SRAM 18 at the cost of increased power consumption.

FIG. 6 illustrates a timing diagram of various signals of SRAM 18 of FIG. 2 during a two cycle, or low power access mode. Note that the clock signal illustrated in FIG. 6 is divided into four phases per cycle for reference, and the phases are labeled uniquely by "T" and a number. Note also that the various signals in FIG. 6 are not drawn to scale.

In two cycle mode, the beginning of the information bus 22 transaction is the same as for a one cycle mode access. Address information from information bus 22 is held at time T3 in address latch 51. The address in address latch 51 is decoded by address comparator 53 during time T4 to determine ownership of the transaction. Address comparator 53 generates match signal MATCH, which is provided to state machine 55 and counter 56 at the end of time T4, if the address in address latch 51 is valid for accessing SRAM 18. The address information in address latch 51 is passed to address latch 52 during time T5 for future use. When match signal MATCH is asserted by address comparator 53, decode enable signal 47 is asserted by state machine 55. The address stored in address latch 52 is passed through multiplexer 54 to address decoders 42 for row and column decoding at time T8. At times T9 and T10 data is transferred between column logic/sense amplifiers 46 and BIU 18. If a read operation is required, BIU 18 drives data onto information bus 22 at time T11.

If match signal MATCH is not asserted at the end of time T4 by address comparator 53, state machine 55 does not assert decode enable signal 47, and the address information stored in address latch 52 is not passed to address decoder 42 for row and column decoding. Address decoder 42, row select 45, and column logic/sense amplifiers 46 are not enabled and remain in a low power quiescent state, thus reducing the power consumption of data processing system 10.

Note that the presence of two address latches, address latches 51 and 52, allow for "pipelining" of sequential transactions to SRAM 18.

By providing a user controlled or automatically controlled two cycle access mode for on-board memory in a data processing system, significant power savings may be derived. The additional clock cycle allows address comparator 53 to determine ownership of an information bus 22 transaction while holding address decoder 42, row select 45, column logic/sense amplifiers 46, and memory array 43 in a low power quiescent state until this circuitry is really needed.

While the invention has been described in the context of a preferred embodiment, it will be apparent to those skilled in the art that the present invention may be modified in numerous ways and may assume many embodiments other than that specifically set out and described above. Accordingly, it is intended by the appended claims to cover all modifications of the invention which fall within the true spirit and scope of the invention.

What is claimed is:

1. A semiconductor memory, comprising:

a memory array having a plurality of memory cells arranged in rows and columns, each memory cell coupled to a word line and to a bit line;

an address decoder, coupled to the memory array, the address decoder accessing a memory cell of the plurality of memory cells in response to receiving a plurality of address signals and a control signal; and control circuitry, coupled to the address decoder, the control circuitry for determining if the plurality of address signals are valid, and in response to determining that the plurality of address signals are valid, causing the address decoder to decode the plurality of address signals for accessing the memory cell in one clock cycle in response to both the control signal being in a first predetermined logic state and the plurality of address signals being valid, and the control circuitry causing the address decoder to decode the plurality of address signals for accessing the memory cell in two clock cycles in response to both the control signal being in a second predetermined logic state and the plurality of address signals being valid, and wherein, if the plurality if address signals are not valid when the control signal is in the second predetermined logic state, the address decoder is prevented from decoding the plurality of address signals.

2. The semiconductor memory of claim 1, wherein the memory array comprises a plurality of static random access memory cells.

3. The semiconductor memory of claim 1, wherein the semiconductor memory is coupled to a central processing unit and to an information bus.

4. The semiconductor memory of claim 3, wherein the control circuitry further comprises a bus interface unit for coupling the address signal from the information bus to the address decoder.

5. The semiconductor memory of claim 4 wherein the bus interface unit comprises:

an address latch for receiving the plurality of address signals during the first clock cycle;

a multiplexer, coupled to the address latch, for receiving the plurality of address signals during the first clock cycle when the control bit is the first predetermined value, and for receiving the plurality of address signal during the second clock cycle when the control bit is the second predetermined value;

a compare circuit, coupled to the address latch, the compare circuit receiving the address signal to determine if the address signal is valid, in response to determining the address signal is valid, the compare circuit providing an address valid signal in a first logic state, in response to the compare circuit determining the address signal is invalid, the compare circuit providing the address valid signal in a second logic state; and control logic for receiving the control bit and the address valid signal, and in response to the control bit being the first predetermined value, the control logic enabling the address decoder during the first clock cycle, and in response to the control bit being the second predetermined value, the control logic enabling the address decoder during the second clock cycle.

6. The semiconductor memory of claim 3, wherein the control signal is a control bit in a control register.

7. A data processing system having a central processing unit and an information bus, comprising:

a memory array having a plurality of memory cells, each memory cell of the plurality of memory cells coupled to a word line and to a bit line, the memory array providing data in response to receiving an address;

an address decoder, coupled to the memory array, for decoding the address to select a memory cell of the plurality of memory cells;

a storage element, coupled to the information bus, for storing a control value; and control circuitry, coupled to the memory array and to the storage element, the control circuitry for determining if the address is valid, and for causing the address decoder to decode the address for accessing the memory cell within a first predetermined number of clock cycles in response to the control value being a first predetermined value, and the control circuitry causing the address decoder to decode the address for accessing the memory cell within a second predetermined number of clock cycles in response to both the control value being a second predetermined value and the address being valid, wherein the first predetermined number of clock cycles is fewer than the second predetermined number of clock cycles, and wherein if the address is not valid when the control signal is in the second predetermined logic state, the address decoder is prevented from decoding the address.

8. The data processing system of claim 7, wherein the memory array includes a plurality of static random access memory cells.

9. The data processing system of claim 7, wherein the storage element is a portion of a control register.

10. The data processing system of claim 7, wherein the first predetermined number of clock signals is one, and the second predetermined number of clock signals is at least two.

11. The data processing system of claim 7, wherein the control circuitry comprises:

an address latch for receiving the address signal during a first clock cycle;

a multiplexer, coupled to the address latch, for receiving the address signal during the first clock cycle when the control bit is the first predetermined value, and for receiving the address signal during a second clock cycle when the control bit is the second predetermined value;

a compare circuit, coupled to the address latch, the compare circuit receiving the address signal to determine if the address signal is valid, and in response to determining the address signal is valid, the compare circuit providing an address valid signal in a first logic state, and in response to the compare circuit determining the address signal is invalid, the compare circuit providing the address valid signal in a second logic state; and control logic for receiving the control bit and the address valid signal, and in response to the control bit being the first predetermined value, the control logic enabling the address decoder during the first clock cycle, and in response to the control bit being in the second predetermined value, the control logic enabling the address decoder during the second clock cycle.

12. The data processing system of claim 11, wherein the control circuitry further comprises a counter, coupled to the compare circuit and to the control logic, the counter disabling the address decoder in response to receiving a predetermined number of consecutive address valid signals in the second logic state.

13. The data processing system of claim 11, wherein the control logic is a synchronizing state machine.

14. The data processing system of claim 11, wherein the control bit is user programmable.

15. In a data processing system having a memory array, a method for accessing the memory array comprising the steps of:

receiving a plurality of address signals during a first clock cycle;

comparing at least a portion of the plurality of address signals to a predetermined address value and providing a match signal of a first logic state in response to the at least a portion of the plurality of address signals matching the predetermined address value;

providing a control value to a control logic circuit;

if the control value has a first value, enabling an address decoder to decode the plurality of address signals during a second clock cycle; and if the control value has a second value, enabling an address decoder to decode the plurality of address signals during the first clock cycle.

16. The method of claim 15, further comprising the steps of:

incrementing a counter during each clock cycle that the match signal is received having a second logic state; and disabling the address decoder after a predetermined number of consecutive match signals of the second logic state are received.

* * * * *